United States Patent
Morita

(10) Patent No.: US 11,829,211 B2
(45) Date of Patent: Nov. 28, 2023

(54) DISPLAY DEVICE

(71) Applicant: SHARP KABUSHIKI KAISHA, Sakai (JP)

(72) Inventor: Ryohei Morita, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 482 days.

(21) Appl. No.: 17/278,155

(22) PCT Filed: Sep. 28, 2018

(86) PCT No.: PCT/JP2018/036359
§ 371 (c)(1),
(2) Date: Mar. 19, 2021

(87) PCT Pub. No.: WO2020/065938
PCT Pub. Date: Apr. 2, 2020

(65) Prior Publication Data
US 2021/0349506 A1    Nov. 11, 2021

(51) Int. Cl.
*G06F 1/18*       (2006.01)
*G09G 3/3275*   (2016.01)
*G09G 3/00*       (2006.01)
*H10K 59/131*   (2023.01)

(52) U.S. Cl.
CPC .............. *G06F 1/189* (2013.01); *G09G 3/035* (2020.08); *G09G 3/3275* (2013.01); *H10K 59/131* (2023.02); *G09G 2330/028* (2013.01); *G09G 2380/02* (2013.01)

(58) Field of Classification Search
CPC .... G09G 3/035; G09G 3/3275; G09G 3/3233; G09G 2380/02; G09G 2330/028; G06F 1/1658
See application file for complete search history.

(56) References Cited

U.S. PATENT DOCUMENTS

| | | | |
|---|---|---|---|
| 2016/0014881 A1* | 1/2016 | Shin | G06F 1/1616 361/749 |
| 2016/0155788 A1 | 6/2016 | Kwon et al. | |
| 2017/0077447 A1* | 3/2017 | Kang | H10K 59/122 |
| 2017/0092230 A1 | 3/2017 | Kuwabara | |
| 2017/0179215 A1 | 6/2017 | Kwon et al. | |
| 2017/0250242 A1 | 8/2017 | Ohara | |
| 2017/0288005 A1 | 10/2017 | Kawata | |
| 2018/0097199 A1* | 4/2018 | Jo | H10K 71/00 |
| 2018/0151662 A1 | 5/2018 | Rhe et al. | |
| 2018/0175131 A1* | 6/2018 | Lee | H10K 59/131 |

(Continued)

FOREIGN PATENT DOCUMENTS

| | | |
|---|---|---|
| CN | 107004694 A | 8/2017 |
| JP | 2017138570 A | 8/2017 |

(Continued)

*Primary Examiner* — Victor A Mandala
*Assistant Examiner* — Lawrence C Tynes, Jr.
(74) *Attorney, Agent, or Firm* — ScienBiziP, P.C.

(57) ABSTRACT

A first lead wiring line and a second lead wiring line intersecting a bending portion of a frame region overlap each other and are electrically connected to each other, and in a first resin layer interposed between the first lead wiring line and the second lead wiring line, a plurality of tapered holes are formed and overlap the first lead wiring line and the second lead wiring line.

16 Claims, 10 Drawing Sheets

(56) References Cited

U.S. PATENT DOCUMENTS

| | | |
|---|---|---|
| 2018/0358426 A1 | 12/2018 | Ohara |
| 2019/0333981 A1 | 10/2019 | Kawata |
| 2020/0099002 A1 | 3/2020 | Kuwabara |
| 2020/0176549 A1 | 6/2020 | Kawata |

FOREIGN PATENT DOCUMENTS

| | | |
|---|---|---|
| JP | 2017152245 A | 8/2017 |
| JP | 2017187580 A | 10/2017 |
| JP | 2018124503 A | 8/2018 |

\* cited by examiner

DISPLAY DEVICE

TECHNICAL FIELD

The disclosure relates to a display device.

BACKGROUND ART

PTL 1 discloses a configuration where a wiring line (a lead wiring line) including a two-dimensional zigzag pattern is formed in a metal layer of a bending portion in a display device including a terminal portion that is bent.

CITATION LIST

Patent Literature

PTL 1: JP 2018-124503 A (published on Aug. 9, 2018)

SUMMARY

Technical Problem

In the configuration described above, a crack may be generated in the wiring line (the lead wiring line) of the bending portion due to stress at the time of bending, and there is concern that disconnection of the wiring line or an increase in resistance of the wiring line may occur due to the crack.

In view of the problems described above, an object of the disclosure is to provide a display device that can prevent generation of a crack in a lead wiring line of a bending portion.

Solution to Problem

A display device according to an aspect of the disclosure is a display device provided with a display region including a light-emitting element and a frame region surrounding the display region on a base material, and provided with a bending portion formed between a terminal portion disposed in one end portion of the frame region and the display region, the display device including a TFT layer including a transistor, and a light-emitting element layer including the light-emitting element, wherein the TFT layer is provided with an inorganic insulating film, a first metal layer, a first resin layer, and a second metal layer in that order, in the bending portion, a slit is formed in the inorganic insulating film, and a filling layer is provided and fills the slit, in the bending portion, a plurality of lead wiring lines intersecting the bending portion are provided, each of the plurality of lead wiring lines connects a wiring line inside the display region and a terminal of the terminal portion, each of the plurality of lead wiring lines includes a first lead wiring line formed in the first metal layer and a second lead wiring line overlapping the first lead wiring line and formed in the second metal layer, the first lead wiring line and the second lead wiring line are electrically connected to each other, and the display device includes at least one of each of a plurality of first holes formed in the filling layer across the first lead wiring line and including surfaces being in contact with the first lead wiring line, and each of a plurality of second holes formed in the first resin layer across the second lead wiring line and including surfaces being in contact with the second lead wiring line.

Advantageous Effects of Disclosure

According to an aspect of the disclosure, generation of a crack in a lead wiring line of a bending portion can be prevented.

DESCRIPTION OF EMBODIMENTS

Hereinafter, the "same layer" means that layers are formed in the same process (film formation step), a "lower layer" means that a layer is formed in a process prior to a process where a layer for comparison is formed, and an "upper layer" means that a layer is formed in a process subsequent to a process where a layer for comparison is formed.

First Embodiment

Figure 1:
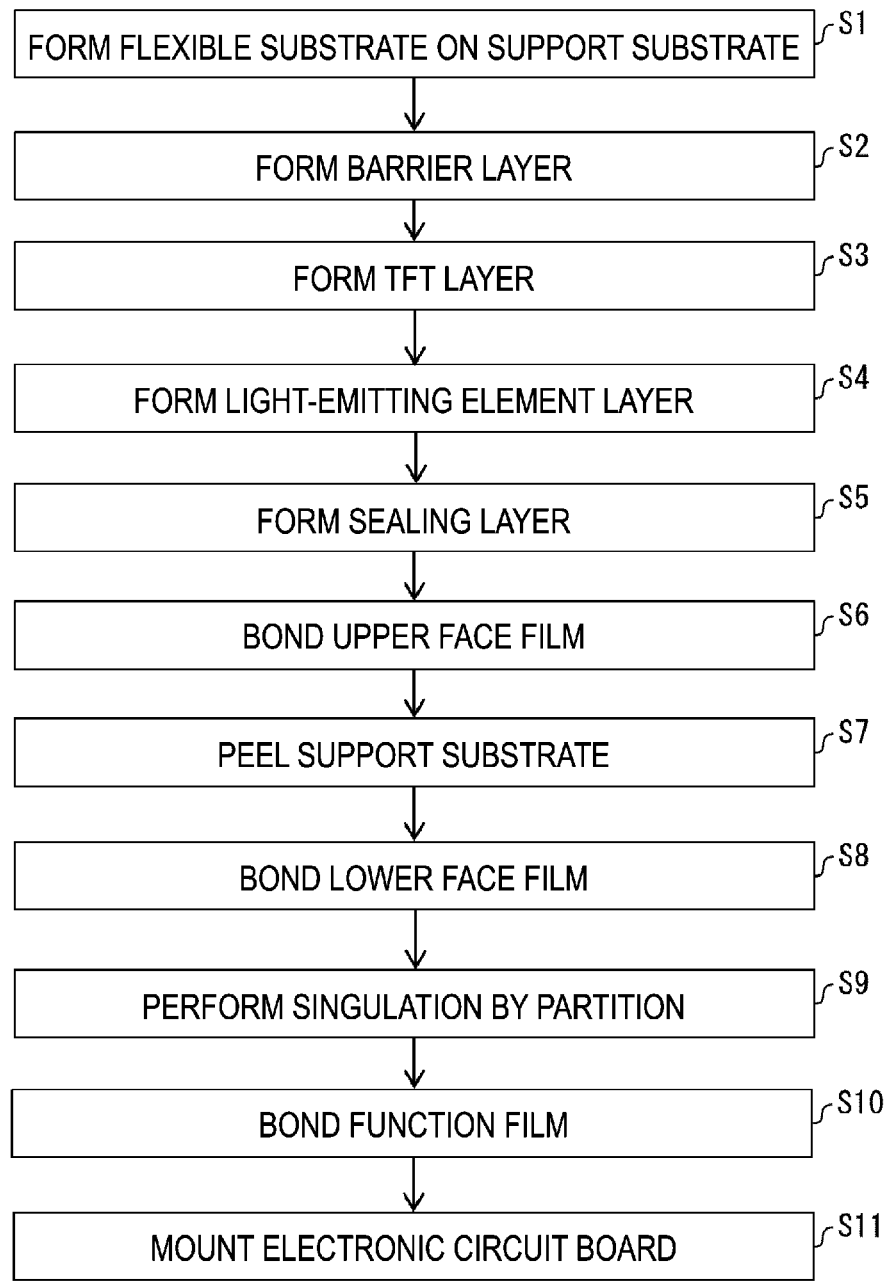
FIG. 1 is a flowchart illustrating an example of a method of manufacturing a display device.

FIG. 1 is a flowchart illustrating an example of a method of manufacturing a display device. FIG. 2(a) is a schematic view illustrating a plane configuration of the display device, and FIG. 2(b) is a schematic view illustrating a cross-sectional configuration of a display region.

Figure 2:
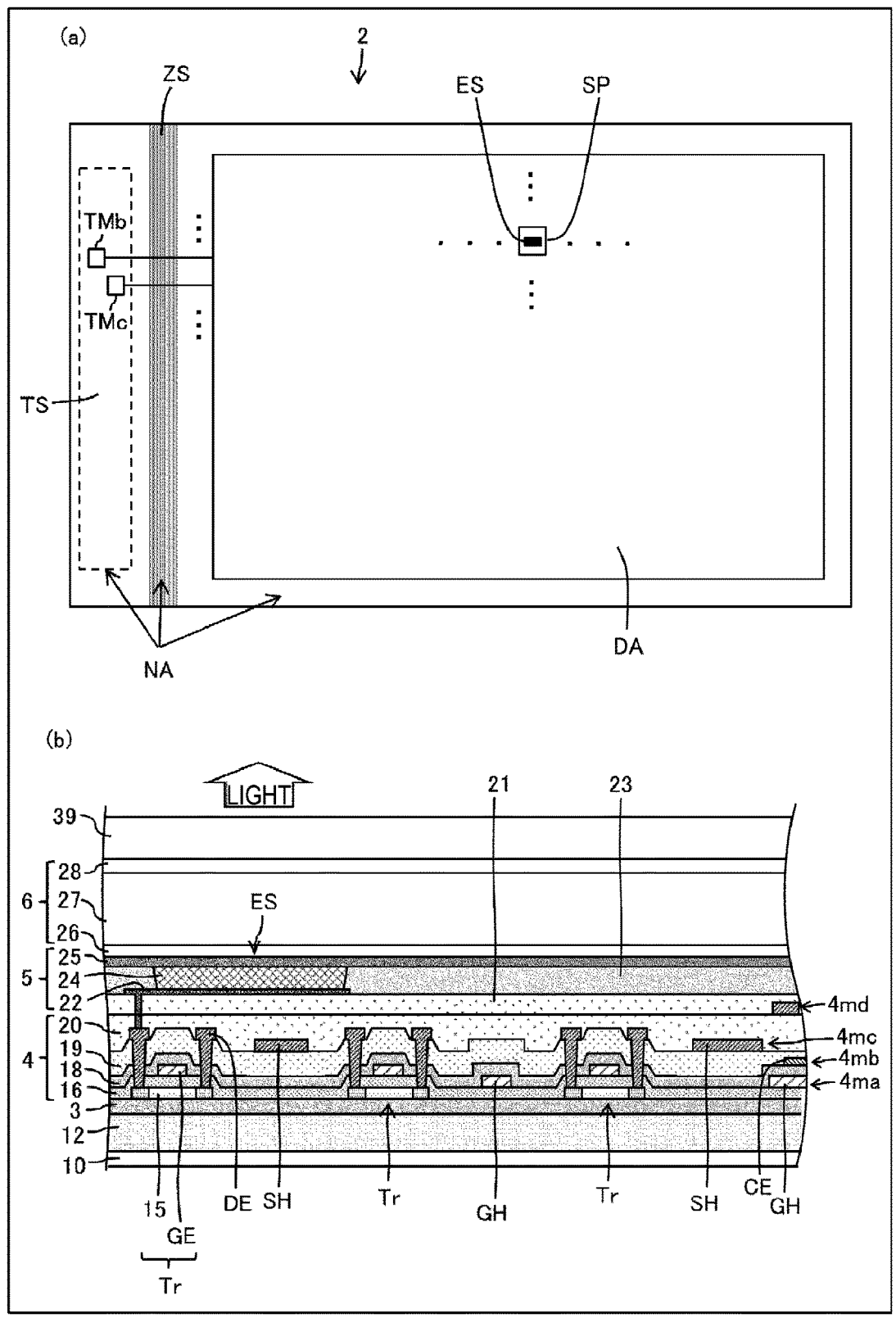
FIG. 2(a) is a schematic view illustrating a plane configuration of the display device.
FIG. 2(b) is a schematic view illustrating a cross-sectional configuration of a display region.

As illustrated in FIG. 1 to FIG. 2, in a case where a flexible display device is manufactured, first, a flexible substrate 12 is formed on a transparent support substrate (for example, a mother glass) (step S1). Next, a barrier layer 3 is formed (step S2). Next, a TFT layer 4 is formed (step S3). Next, a light-emitting element layer 5 of a top-emitting type is formed (step S4), A light-emitting element ES of a subpixel SP is formed in the light-emitting element layer 5 of a display region DA. Next, a sealing layer 6 is formed (step S5). Next, an upper face film is bonded on the sealing layer 6 (step S6). Next, the support substrate is peeled from the flexible substrate 12 by irradiation with laser light or the like (step S7). Next, a lower face film 10 is bonded to a lower face of the flexible substrate 12 (step S8). Next, a layered body including the lower face film 10, the flexible substrate 12, the barrier layer 3, the TFT layer 4, the light-emitting element layer 5, and the sealing layer 6 is subjected to partition, and a plurality of individual pieces are obtained (step S9). Next, a function film 39 is bonded to the individual pieces obtained (step S10). Next, an electronic circuit board (a driver chip, a flexible printed circuit board, or the like) is mounted on a terminal portion TS (including terminals TMb and TMc) of a frame region (step S11). After step S11, a display device 2 can be bent in a bending portion ZS of a frame region NA.

Steps S1 to S11 are performed by a display device manufacturing apparatus (including a film formation apparatus that performs each step of steps S1 to S5).

Figure 3:
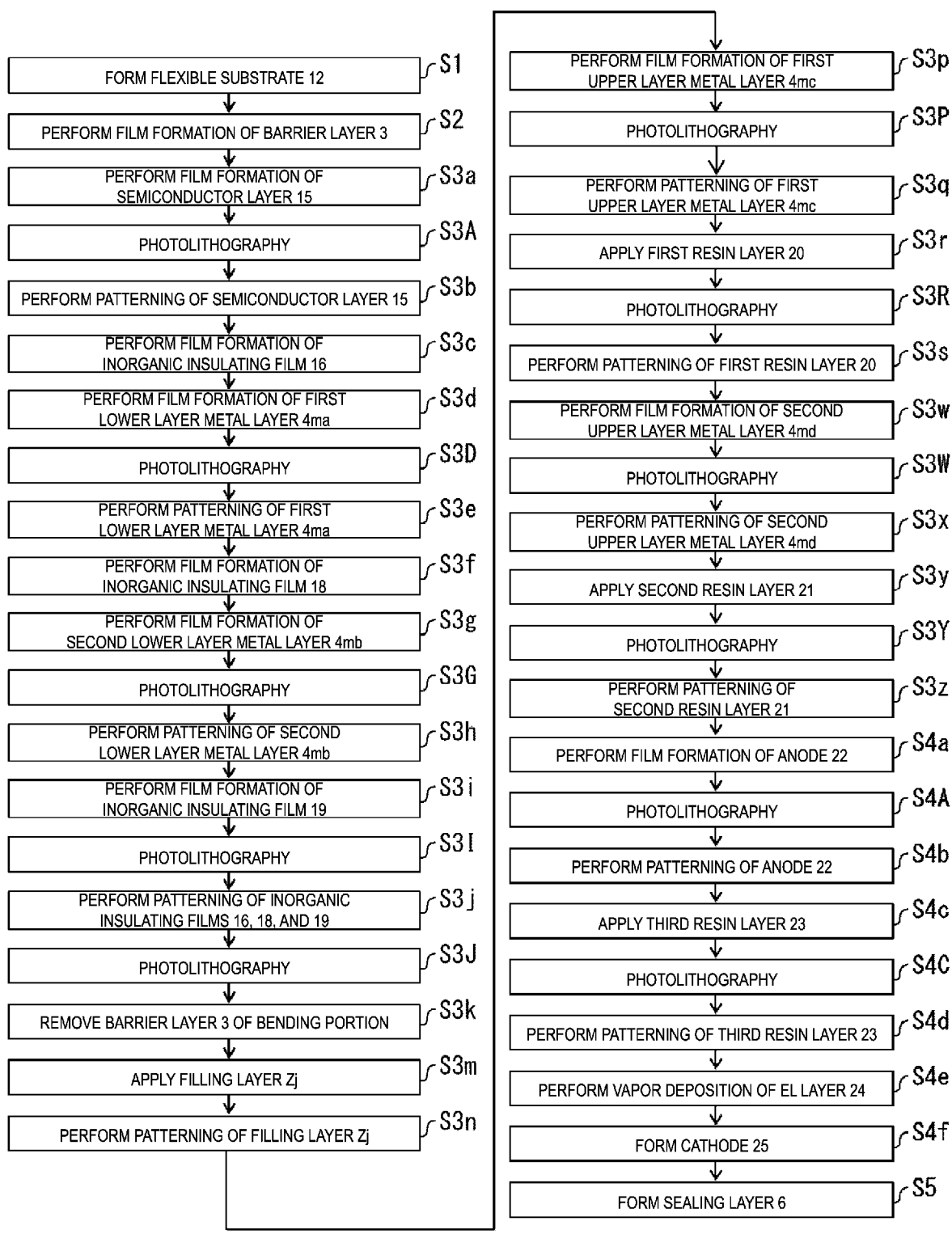
FIG. 3 is a flowchart illustrating details of a portion of FIG. 2.

FIG. 3 is a flowchart illustrating details of steps S3 and step S4 of FIG. 2. As illustrated in FIGS. 1 to 3, after step S2, film formation of a semiconductor layer 15 (step S3a), photolithography (step S3A), and patterning of the semiconductor layer 15 (step S3b) are performed. Then, film formation of an inorganic insulating film 16 that is a lower layer inorganic insulating film (step S3c), film formation of a first lower layer metal layer 4ma (step S3d), photolithography (step S3D), and patterning of the first lower layer metal layer 4ma (step S3e) are performed. Then, film formation of an inorganic insulating film 18 that is a middle layer inorganic insulating film (step S3f), film formation of a second lower layer metal layer 4mb (step S3g), photolithography (step S3G), and patterning of the second lower layer metal layer 4mb (step S3h) are performed.

Then, film formation of an inorganic insulating film 19 that is an upper layer inorganic insulating film (step S3i), photolithography (step S3I), patterning of the inorganic insulating films 16, 18, and 19 (step S3j), photolithography (step S3J), and removal of the barrier layer 3 of the bending portion (step S3k) are performed.

Then, application of a filling layer Zj (step S3m) and patterning of the filling layer Zj (step S3n) are performed. Then, film formation of a first upper layer metal layer 4mc is (step S3p), photolithography (step S3P), and patterning of the first upper layer metal layer 4mc (step S3q) are performed. Then, application of a first resin layer 20 (step S3r), photolithography (step S3R), and patterning of the first resin layer 20 (step S3s) are performed.

Then, film formation of a second upper layer metal layer 4md (step S3w), photolithography (step SPX), and patterning of the second upper layer metal layer 4md (step S3x) are performed. Then, application of a second resin layer 21 (step S3y), photolithography (step S3Y), and patterning of the second resin layer 21 (step S3z) are performed.

Then, film formation of an anode 22 (step S4a), photolithography (step S4A), and patterning of the anode 22 (step S4b) are performed. Then, application of a third resin layer 23 (step S4c), photolithography (step S4C), patterning of the third resin layer 23 (step S4d), vapor deposition of an EL layer 24 (step S4e), and formation of a cathode 25 (step S4f) are performed. Subsequently, the sealing layer 6 is formed (step S5).

An example of a material of the flexible substrate 12 (base material) includes polyimide. The flexible substrate 12 can also be replaced by two polyimide films and an inorganic insulating film interposed between the two polyimide films.

The barrier layer (barrier film) 3 is a layer that prevents foreign matters such as water, oxygen, and a mobile ion from entering the TFT layer 4 and the light-emitting element layer 5, and the barrier layer (barrier film) 3 can include, for example, a silicon oxide film, a silicon nitride film, or a silicon oxynitride film that is formed by CVD, or a layered film of these films.

Low-temperature polysilicon (LTPS) or an oxide semiconductor (for example, an In—Ga—Zn—O based semiconductor) can be used for the semiconductor layer 15.

Each of the first lower layer metal layer 4ma, the second lower layer metal layer 4mb, the first upper layer metal layer 4mc, and the second upper layer metal layer 4md includes, for example, a single-layer metal film or a multilayered metal film including at least one of aluminum, tungsten, molybdenum, tantalum, chromium, titanium, and copper. Particularly, each of the first upper layer metal layer 4mc and the second upper layer metal layer 4md can be a low resistance metal layer obtained by interposing an aluminum film between two titanium films. In addition, the second upper layer metal layer 4md can also be formed with two layers including an aluminum film and a titanium film formed in an upper layer of the aluminum film.

The first lower layer metal layer 4ma and the second lower layer metal layer 4mb are preferably formed with the same metal material, and the first upper layer metal layer 4mc and the second upper layer metal layer 4md are preferably formed with the same metal material.

Each of the inorganic insulating films 16, 18, and 19 and a protection layer PF can include, for example, a silicon oxide (SiOx) film or a silicon nitride (SiNx) film that is formed by CVD, or a layered film of these films.

The filling layer Zj, the first resin layer 20, and the second resin layer 21 can include, for example, a coatable organic material such as polyimide and an acrylic resin.

A transistor Tr includes the semiconductor layer 15, a gate electrode provided in the first lower layer metal layer 4ma, and a conduction electrode DE (a source electrode/a drain electrode) provided in the first upper layer metal layer 4mc.

Figure 4:
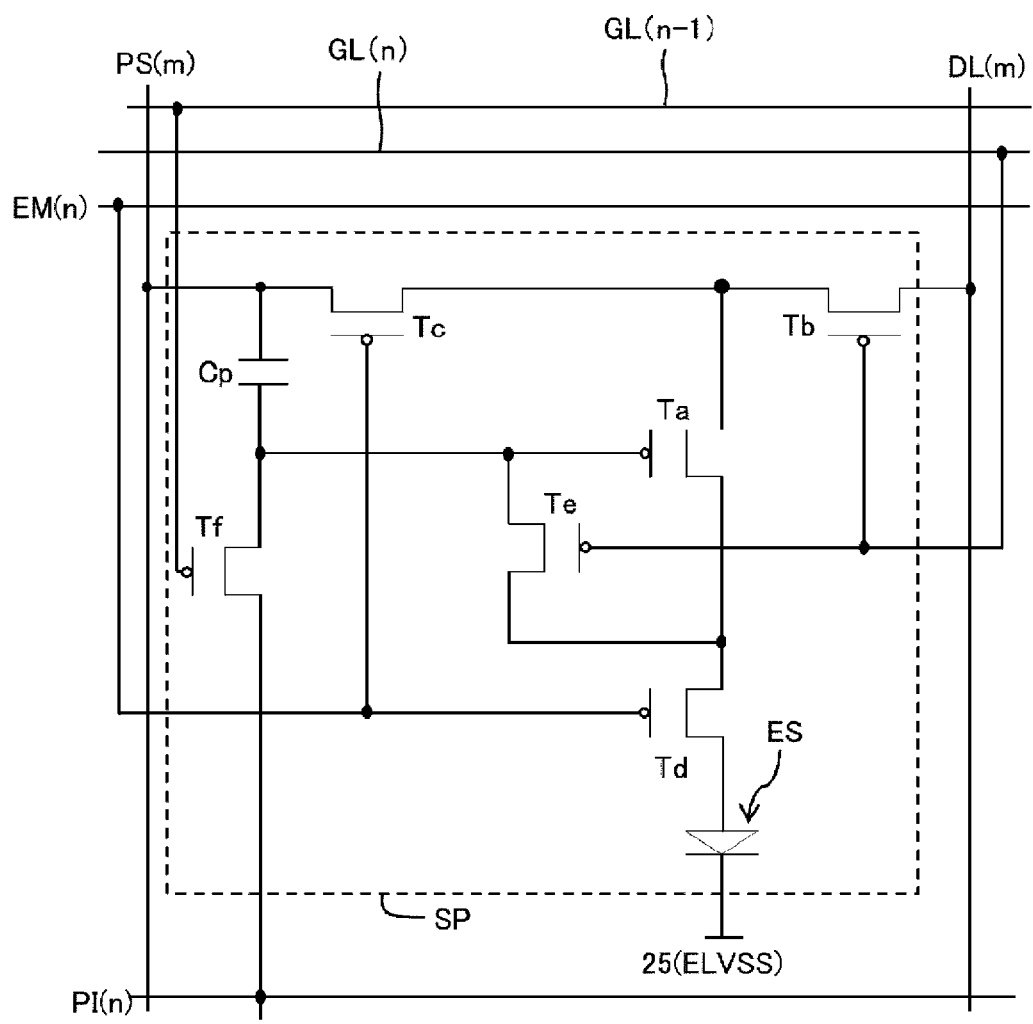
FIG. 4 is a circuit diagram illustrating a configuration of a subpixel.

In the display region DA, a pixel circuit of the subpixel SP (corresponding to an mth column and an nth row) illustrated in FIG. 4 is provided corresponding to an intersection point of the mth column of a data signal line DL(m) and the nth row of a scanning signal line GL(n). Note that the configuration of the pixel circuit described here is an example, and other known configurations can also be employed. The pixel circuit illustrated in FIG. 4 includes one OLED element ES, six transistors (a drive transistor Ta, a writing control transistor Tb, a power supply control transistor Tc, a light emission control transistor Td, a threshold voltage compensation transistor Te, and an initialization transistor Tf), and one capacitor Cp. The transistors Ta to Tf are p-channel transistors. The capacitor Cp is a capacitance element including two electrodes. A light emission control line EM(n) is connected to control terminals of the power supply control transistor Tc and the light emission control transistor Td. The scanning signal line GL(n) is connected to control terminals of the writing control transistor Tb and the threshold voltage compensation transistor Te. A scanning signal line GL(n−1) is connected to a control terminal of the initialization transistor Tf. An initialization power source line PI(n) is connected to one conduction terminal of the initialization transistor Tf. The data signal line DL(m) is connected to one conduction terminal of the writing control transistor Tb. A high power supply voltage line PS(m) through which a high power supply voltage ELVDD is supplied is connected to one conduction terminal of the power supply control transistor Tc. The cathode 25 of the light-emitting element ES is a common electrode common to a plurality of the pixel circuits, and is electrically connected to a low power supply voltage ELVSS.

The pixel circuit of FIG. 4 is an example and is not limited to this. The pixel circuit can also be constituted by using an n-channel transistor.

In the display region DA, for example, the scanning signal line GL(n), the light emission control line EM(n), a gate electrode of each of the transistors (Ta to Tf), and a gate wiring line GH (see FIG. 2) are provided in the first lower layer metal layer 4$ma$, and the initialization power source line PI(n) and one electrode CE (see FIG. 2) of the capacitor Cp are provided in the second lower layer metal layer 4$mb$, and the data signal line DL(m), the conduction electrode DE (the source/drain electrodes) of each of the transistors, and a source wiring line SH (see FIG. 2) are provided in the first upper layer metal layer 4$mc$, and the high voltage power source line PS(m) is provided in the second upper layer metal layer 4$md$. These are merely examples and do not limit which metal layer includes which wiring line.

The light-emitting element layer 5 includes the anode 22, the third resin layer (the edge cover) 23 covering an edge of the anode 22, the electroluminescent (EL) layer 24, and the cathode 25 formed in an upper layer overlying the EL layer 24. For example, a coatable organic material such as polyimide and an acrylic resin can be used for the third resin layer 23.

In the display region DA, a display element is provided for each subpixel SP. The display element includes the light-emitting element ES (for example, an organic light emitting diode (OLED), a quantum dot light emitting diode (QLED)) including the anode 22 having an island shape, the EL layer 24, and the cathode 25 and formed in the light-emitting element layer 5, and a control circuit (formed in the TFT layer 4) of the light-emitting element ES.

The EL layer 24 is constituted by, for example, layering a hole injection layer, a hole transport layer, a light-emitting layer, an electron transport layer, and an electron injection layer in order from the lower layer side. The light-emitting layer is formed in an island shape and overlaps an opening of the third resin layer (edge cover) 23 by vapor deposition or an ink-jet method. Other layers are formed in an island shape or a solid-like shape (common layer). In addition, a configuration where one or more of the hole injection layer, the hole transport layer, the electron transport layer, and the electron injection layer are not formed can also be made.

In a case where a light-emitting layer of an OLED is formed by vapor deposition, a fine metal mask (FMM) is used. The FMM is a sheet including a large number of through-holes (for example, made of an invar material), and a light-emitting layer having an island shape (corresponding to one subpixel) is formed with organic matter having passed through one through-hole.

In the case of a light-emitting layer of a QLED, a light-emitting layer having an island shape (corresponding to one subpixel) can be formed by, for example, applying by ink-jet a solvent including diffused quantum dot.

The anode (anode electrode) 22 is constituted by, for example, layering indium tin oxide (ITO) and silver (Ag) or an alloy including Ag, and the anode (anode electrode) 22 has light reflectivity. The cathode (cathode electrode) 25 can include a transparent conductive material such as an MgAg alloy (ultrathin film), ITO, and IZO (indium zinc oxide).

In a case where the light-emitting element ES is an OLED, a positive hole and an electron recombine inside the light-emitting layer by a drive current between the anode 22 and the cathode 25, and in a process in which an exciton thus generated transits to a ground state, light is emitted. Since the cathode 25 is transparent and the anode 22 has light reflectivity, light emitted from the EL layer 24 travels upward and top-emitting is realized.

In a case where the light-emitting element ES is a QLED, a positive hole and an electron recombine inside the light-emitting layer by a drive current between the anode 22 and the cathode 25, and in a process in which an exciton thus generated transits from a conduction band level to a valence band level of a quantum dot, light is emitted (fluoresce).

A light-emitting element other than the OLED and QLED described above (such as an inorganic light emitting diode) may be formed in the light-emitting element layer 5.

The sealing layer 6 is transparent, and includes an inorganic sealing film 26 that covers the cathode 25, an organic buffer film 27 formed in an upper layer overlying the inorganic sealing film 26, and an inorganic sealing film 28 formed in an upper layer overlying the organic buffer film 27. The sealing layer 6 that covers the light-emitting element layer 5 prevents foreign matters such as water, oxygen, and a mobile ion from infiltrating the light-emitting element layer 5.

Each of the inorganic sealing film 26 and the inorganic sealing film 28 is an inorganic insulating film and can include, for example, a silicon oxide film, a silicon nitride film, or a silicon oxynitride film that is formed by CND, or a layered film of these films. The organic buffer film 27 is a transparent organic film having a flattening effect and can include a coatable organic material such as an acrylic resin. The organic buffer film 27 can be formed by, for example, ink-jet application.

The lower face film 10 is, for example, a PET film for realizing a display device having excellent flexibility by bonding the PET film to the lower face of the flexible substrate 12 after peeling the support substrate. The function film 39 includes at least one of an optical compensation function, a touch sensor function, and a protection function, for example.

Figure 5:
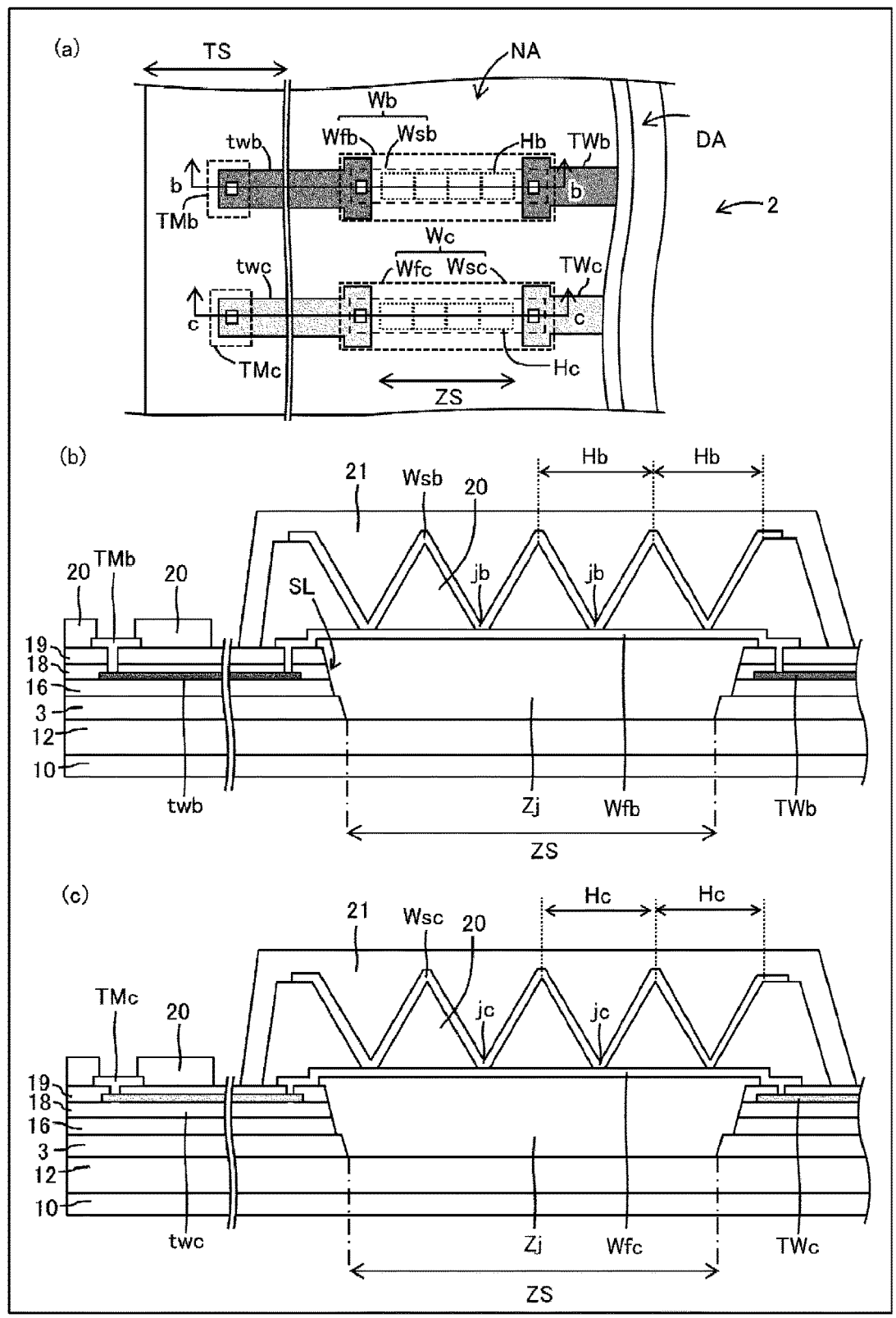
FIG. 5(a) is a plan view illustrating a configuration of a frame region in a first embodiment.
FIG. 5(b) is a cross-sectional view taken along b-b of FIG. 5(a)
FIG. 5(c) is a cross-sectional view taken along c-c of FIG. 5(a).
Figure 6:
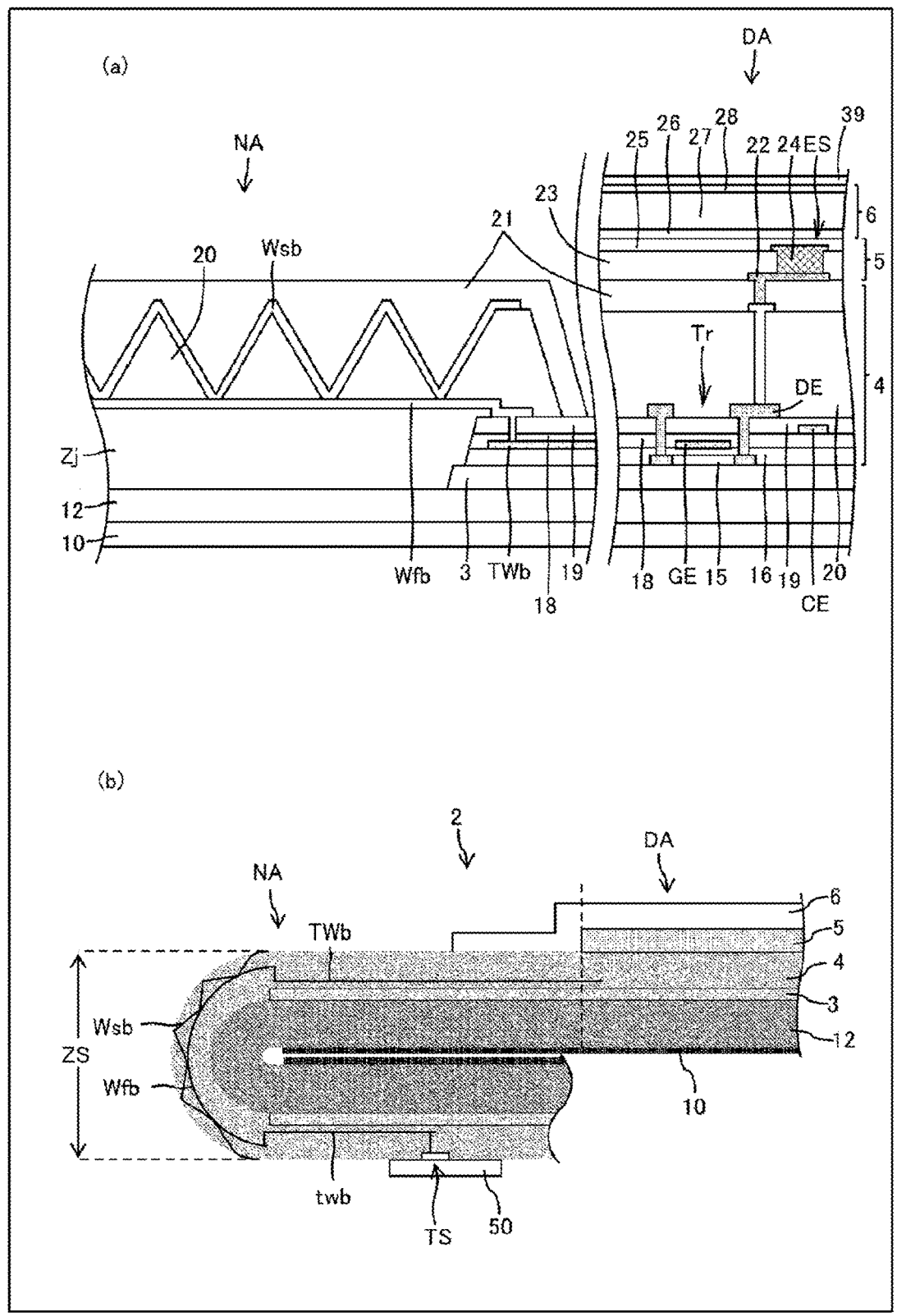
FIG. 6(a) is a cross-sectional view illustrating the configurations of the display region and the frame region in the first embodiment.
FIG. 6(b) is a cross-sectional view illustrating a bending state of the frame region.

FIG. 5($a$) is a plan view illustrating a configuration of the frame region in the first embodiment, FIG. 5($b$) is a cross-sectional view taken along b-b of FIG. 5($a$), and FIG. 5($c$) is a cross-sectional view taken along c-c of FIG. 5($a$). FIG. 6($a$) is a cross-sectional view illustrating configurations of the display region and the frame region in the first embodiment, and FIG. 6($b$) is a cross-sectional view illustrating a bending state of the frame region.

In the display device 2 illustrated in FIG. 2, and FIGS. 5 and 6, the display region DA including the transistor Tr and the display element ES, and the frame region NA surrounding the display region DA are provided on the flexible substrate 12, and the bending portion ZS is provided between the terminal portion TS formed in the end portion of the frame region NA and the display region DA.

The first upper layer metal layer 4$mc$ (the first metal layer), the first resin layer 20, the second upper layer metal layer 4$md$ (the second metal layer), the second resin layer 21, and the third resin layer 23 are provided in that order in an upper side of the inorganic insulating film 19 formed across the display region DA and the frame region NA. Each of the first upper layer metal layer 4$mc$ (including the data signal line and the conduction terminal DE of the transistor Tr) and the second upper layer metal layer 4$md$ (including the high voltage power source line) is a metal layer formed with the same material and having lower resistance than resistance of each of the first lower layer metal layer 4$ma$ and the second lower layer metal layer 4$mb$.

In the first embodiment, first lead wiring lines Wfb and \Vfc provided in the first upper layer metal layer 4$mc$ are formed and intersect the bending portion ZS, and second lead wiring lines Wsb and Wsc provided in the second upper layer metal layer 4md are formed and intersect the bending portion ZS. The first lead wiring line Wfb and the second lead wiring line Wsb constituting a lead wiring line Wb extend in the same direction and overlap each other, and are electrically connected to each other. Similarly, the first lead wiring line Wfc and the second lead wiring line Wsc constituting a lead wiring line Wc extend in the same direction and overlap each other, and are electrically connected to each other.

Display side wiring lines TWb and TWc adjacent to each other, and terminal side wiring lines twb and twc adjacent to each other are provided in the frame region NA. The display side wiring line TWb and the terminal side wiring line twb are formed in the first lower layer metal layer 4ma (including a gate electrode GE of the transistor Tr) and the bending portion ZS is interposed between the display side wiring line TWb and the terminal side wiring line twb, and the display side wiring line TWb and the terminal side wiring line twb are electrically connected to each other via the first lead wiring line Wfb and the second lead wiring line Wsb. The display side wiring line TWc and the terminal side wiring line twc are disposed in the second lower layer metal layer 4mb (including the capacitance electrode CE that is the electrode of the capacitance electrode Cp) and the bending portion ZS is interposed between the display side wiring line TWc and the terminal side wiring line twc, and the display side wiring line TWc and the terminal side wiring line twc are electrically connected to each other via the first lead wiring line Wfc and the second lead wiring line Wsc.

As illustrated in FIG. 5, the first lead wiring line Wfb is connected to the display side wiring line TWb via a contact hole formed in the inorganic insulating films 18 and 19 and is connected to the terminal side wiring line twb via a contact hole formed in the inorganic insulating films 18 and 19. In addition, the first lead wiring line Wfc is connected to the display side wiring line TWc via a contact hole formed in the inorganic insulating film 19 and is connected to the terminal side wiring line twc via a contact hole formed in the inorganic insulating film 19.

In the bending portion ZS, a slit SL is formed in the inorganic insulating films 16, 18, and 19, and the filling layer Zj is provided and fills the slit SL. In the bending portion ZS, the filling layer Zj fills a slit of the barrier layer 3. There is no inorganic insulating film having low flexibility in the bending portion ZS, and the first upper layer metal layer 4mc, the first resin layer 20, the second upper layer metal layer 4md, and the second resin layer 21 are layered in the upper layer side of the filling layer Zj.

A plurality of tapered holes Hb (second holes) overlapping the first lead wiring line Wfb and the second lead wiring line Wsb, and a plurality of tapered holes Hc (second holes) overlapping the first lead wiring line Wfc and the second lead wiring line Wsc are formed in the first resin layer 20. The tapered holes adjacent to each other in an extending direction (a wiring line direction) of each of the lead wiring lines are continuous in openings of the tapered holes adjacent to each other.

Each of the tapered holes Hb and He has a shape that tapers toward the lower layer side and passes through the first resin layer 20. Thus, as illustrated in FIG. 5(b), the second lead wiring line Wsb has a shape including irregularities in accordance with the plurality of tapered holes Hb, and a portion of the first lead wiring line Wfb that is substantially flat (a portion exposed to a bottom of each of the plurality of tapered holes Hb) and a plurality of concave-side bottom portions jb of the second lead wiring line Wsb are in contact with each other, and the first lead wiring line Wfb and the second lead wiring line Wsb are electrically connected to each other. In addition, as illustrated in FIG. 5(c), the second lead wiring line Wsc has a shape including irregularities in accordance with the plurality of tapered holes Hc, and a portion of the first lead wiring line Wfc that is substantially flat (a portion exposed to a bottom of each of the plurality of tapered holes Hc) and a plurality of concave-side bottom portions jc of the second lead wiring line Wsc are in contact with each other, and the first lead wiring line Wfc and the second lead wiring line Wsc are electrically connected to each other. The second lead wiring lines Wsb and Wsc are covered with the second resin layer 21.

As illustrated in FIG. 6(b), after an electronic circuit board 50 is mounted in the terminal portion TS, a region outside the bending portion ZS (a region including the terminal portion TS) is bent back to the rear face side (the lower face film 10 side) by 180 degrees, and thus frame narrowing is realized. Note that in the bending portion ZS, desirably, a slit is also formed in the lower face film 10.

In the first embodiment, as illustrated in FIGS. 5 and 6, each of the tapered holes and He has a square pyramid shape directed downward, and each of the lead wiring line Wb (Wfb and Wsb) and the lead wiring line Wc (Wfc and Wsc) forms a space truss structure. This space truss structure is interposed between the filling layer Zj that is flexible and the second resin layer 21 and the interior of the space truss structure is filled with the first resin layer 20 that is flexible, and thus, the space truss structure has high stress resistance at the time of bending. Accordingly, in the first embodiment, generation of a crack in the lead wiring lines Wb and Wc can be prevented. As a result, a defect such as occurrence of disconnection or an increase in resistance of the lead wiring lines Wb and Wc can be avoided.

The holes (contact holes) formed in the first resin layer 20 are the tapered holes Hb and Hc, and thus in a dimension in the extending direction of the lead wiring line Wb, a dimension of contact of the first lead wiring line Wfb and the second lead wiring line Wsb in each of the contact holes becomes a minimum dimension. Accordingly, the stress resistance of the lead wiring line Wb at the time of bending can be increased securely while electrical connection of the first lead wiring line Wfb and the second lead wiring line Wsb is ensured.

Figure 7:
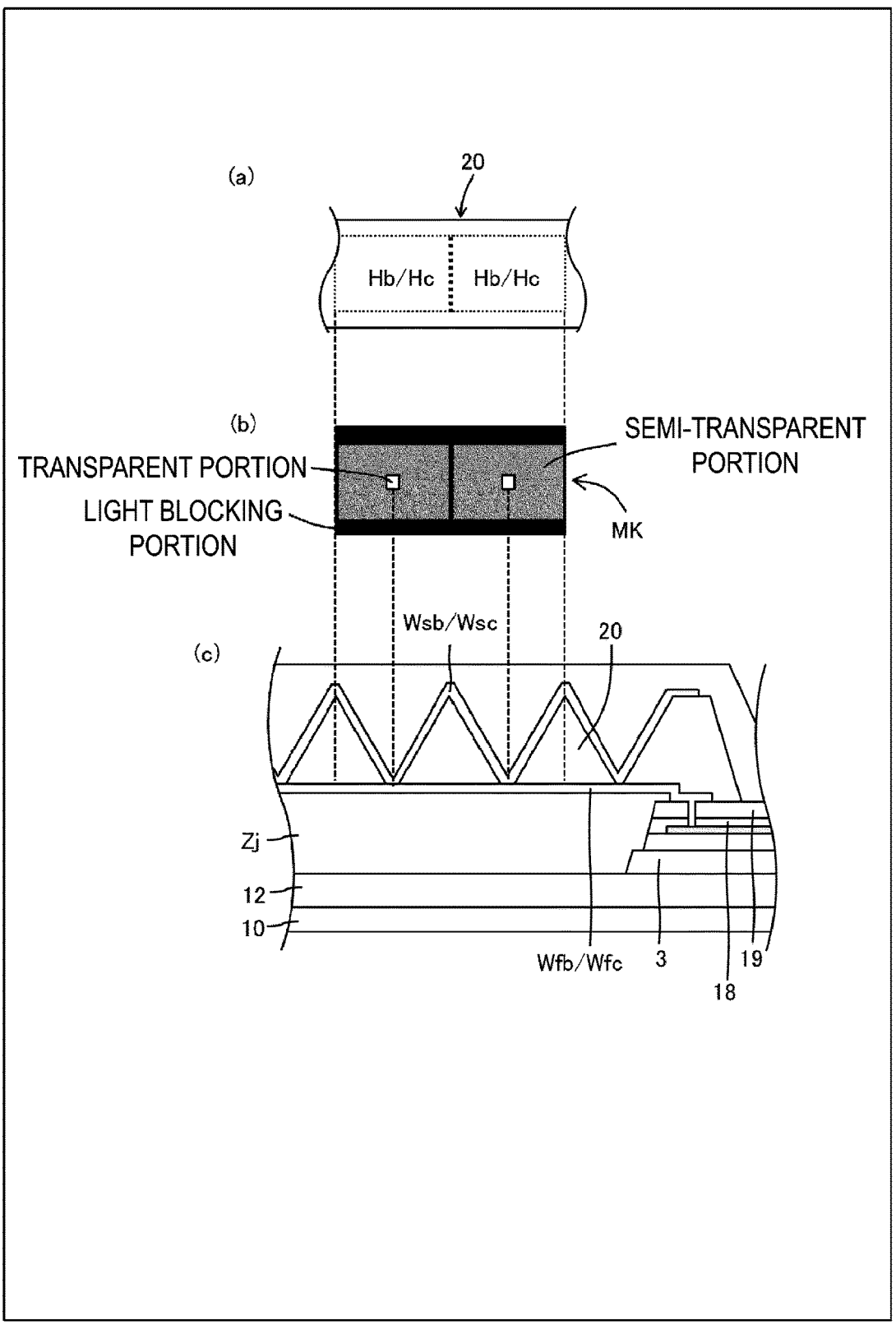
FIG. 7(a) is a plan view illustrating a tapered hole of a first resin layer.
FIG. 7(b) is a plan view of a mask used for forming the tapered hole.
FIG. 7(c) is a cross-sectional view of the tapered hole.

FIG. 7(a) is a plan view illustrating the tapered hole of the first resin layer, FIG. 7(b) is a plan view of a mask used for forming the tapered hole, and FIG. 7(c) is a cross-sectional view of the tapered hole. Each of the tapered holes Hb and Hc of the first resin layer 20 can be formed by, for example, applying a photosensitive resin material, and subsequently performing photolithography by using a graytone mask MK that includes a transparent portion (corresponding to a bottom portion of each of the tapered holes Hb and Hc), a semi-transparent portion surrounding the transparent portion, and a light blocking portion (corresponding to a portion where no hole is formed) surrounding the semi-transparent portion as illustrated in FIG. 7(b).

Figure 8:
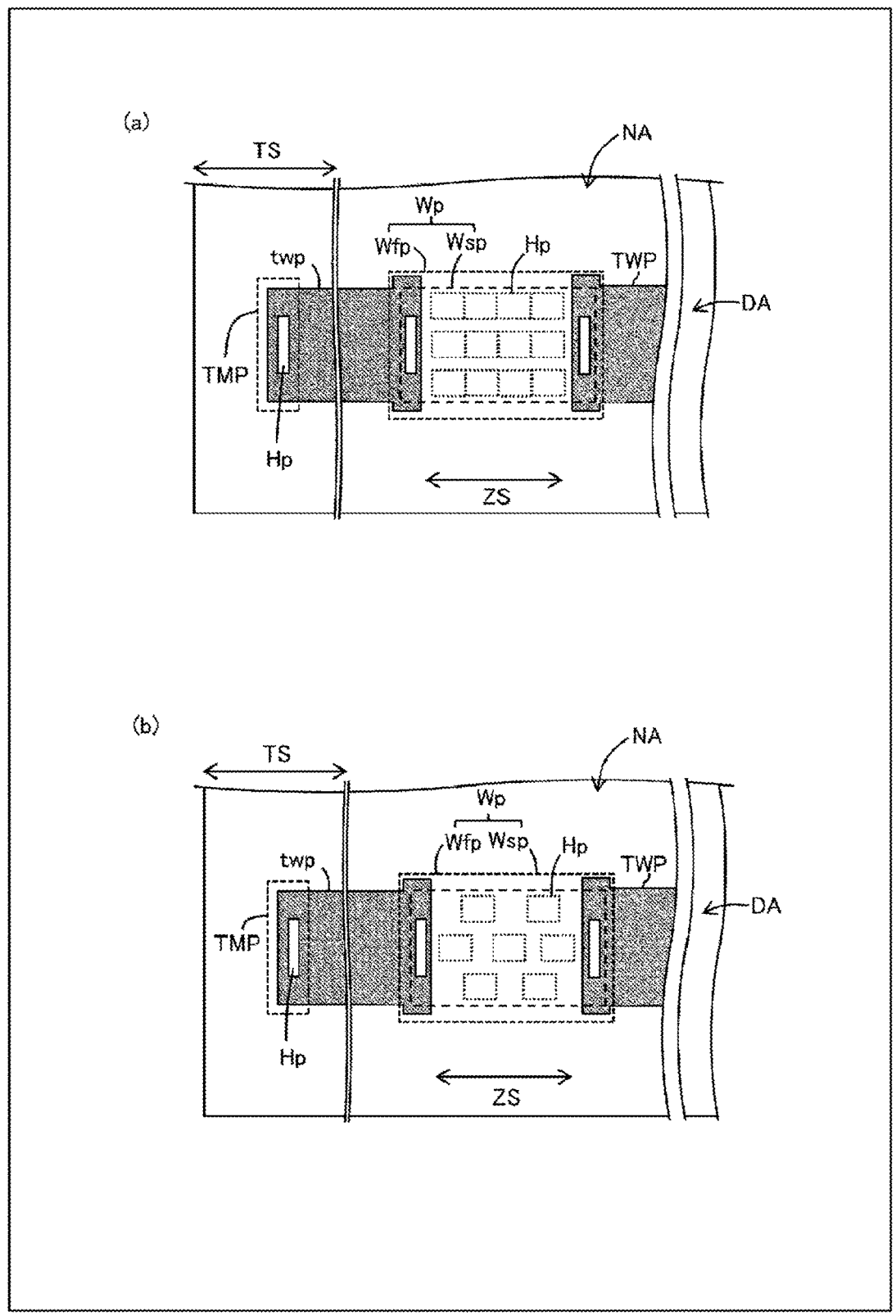
FIG. 8(a) is a plan view illustrating a configuration for power supply voltage transmission.
FIG. 8(b) is a plan view illustrating a modification of FIG. 8(a).

FIG. 8(a) a plan view illustrating a configuration of a wiring line through which the high power supply voltage ELVDD and the low power supply voltage ELVSS are transmitted to the display region (hereinafter, abbreviated as for power supply voltage transmission), and FIG. 8(b) is a plan view illustrating a modification of FIG. 8(a). Each of a display side wiring line TWP and a terminal side wiring line twp for power supply voltage transmission has a width greater than the width of each of a display side wiring line and a terminal side wiring line for data signal transmission.

Then, as illustrated in FIG. 5(a), as for the lead wiring line Wb for data signal transmission (the first lead wiring line Wfb and the second lead wiring line Wsb), a configuration where one column of the plurality of tapered holes Hb overlapping these wiring lines Wfb and Wsb is aligned (the number of the holes is 4) can be made. On the other hand, as illustrated in FIG. 8(a), as for a lead wiring line Wp for power supply voltage transmission (a first lead wiring line Wfp and a second lead wiring line Wsp), a configuration where a plurality of columns of a plurality of tapered holes Hp overlapping these wiring lines Wfp and Wsp are aligned (the number of the holes is 12) can be made, and improvement of a decrease in resistance and stress resistance can be achieved. The terminal side wiring line twp is connected to a power supply terminal TMP (formed in the first upper layer metal layer 4mc) via the contact hole Hp formed in the inorganic insulating films 18 and 19 (or in the inorganic insulating film 19 alone). The arrangement of the plurality of tapered holes Hp is not limited to the matrix arrangement as illustrated in FIG. 8(a), and delta arrangement as illustrated in FIG. 8(b) may be employed.

Figure 9:
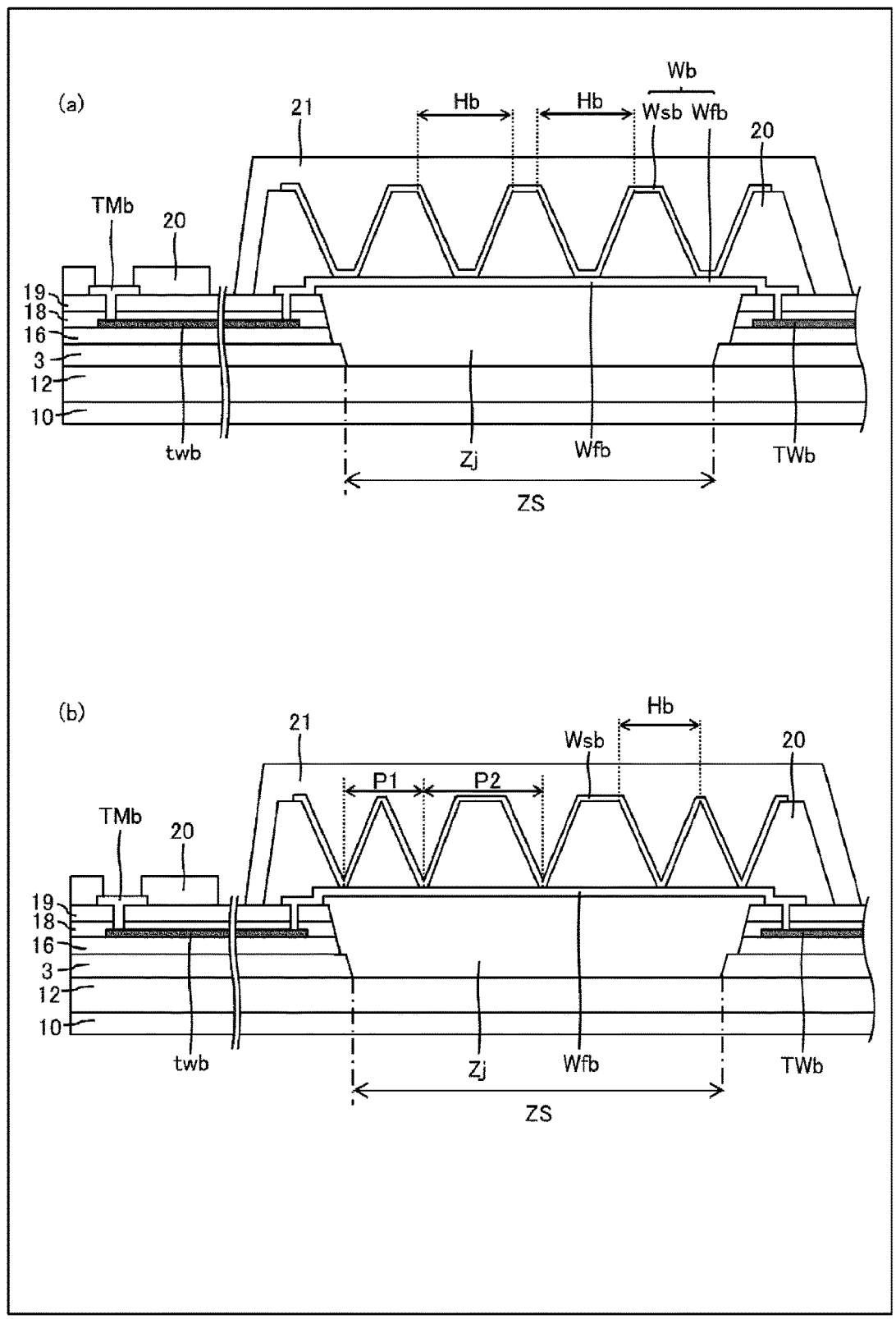
FIGS. 9(a) and 9(b) are cross-sectional views illustrating another configuration of the frame region.

FIGS. 9(a) and 9(b) are cross-sectional views illustrating another configuration of the frame region. In FIG. 5, each of the tapered holes Hb and Hc of the first resin layer 20 has a square pyramid shape directed downward, but the shape of each of the tapered holes is not limited to this. A cone shape directed downward may be used. In addition, as illustrated in FIG. 9(a), a truncated pyramid shape directed downward (the area of a bottom portion is smaller than the area of an opening) or a truncated cone shape directed downward may be used.

As for the plurality of tapered holes illustrated in FIG. 5(b), an inter-hole distance (inter-center distance: pitch) in the extending direction of the lead wiring line is set in accordance with a radius of curvature of the bending portion. Specifically, as the radius of curvature of the bending portion becomes smaller, the inter-hole distance is set to be shorter. In this manner, the number of contact points of the first lead wiring line Wfb and the second lead wiring line Wsb increases, and more effective stress distribution can be made. The same also applies to the plurality of tapered holes Hc illustrated in FIG. 5(c).

As for the plurality of tapered holes Hb illustrated in FIG. 5(b), desirably, an inter-hole distance with respect to the wiring line direction (the extending direction of the lead wiring line) is made different in accordance with a position in the wiring line direction of the bending portion ZS (a left/right direction in the figure), For example, as illustrated in FIG. 9(b), a configuration where an inter-hole distance (pitch) P2 in a center portion is greater than an inter-hole distance (pitch) P1 in an end portion of the bending portion ZS may be made. In addition, in the bending portion ZS, a configuration where, as the radius of curvature of the bending portion ZS becomes smaller, the inter-hole distance becomes greater may be made. In this manner, bending becomes easy to perform. The same also applies to the plurality of tapered holes illustrated in FIG. 5(c).

Second Embodiment

Figure 10:
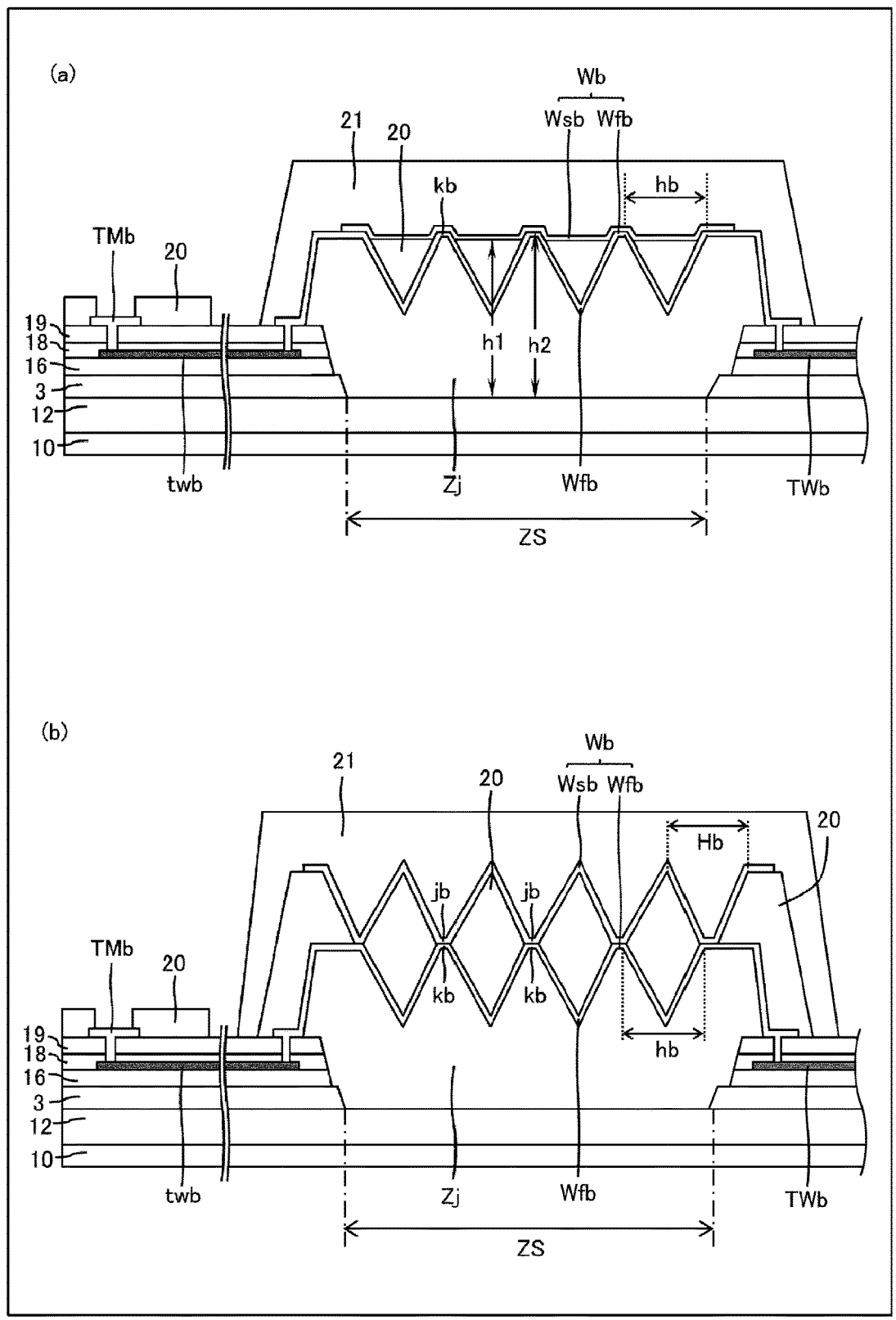
FIGS. 10(a) and 10(b) are cross-sectional views illustrating a configuration of a frame region of a second embodiment.

FIGS. 10(a) and 10(b) are cross-sectional views illustrating a configuration of frame region of a second embodiment. In FIG. 10(a), a first lead wiring line Wfb is formed in a shape including irregularities in accordance with a plurality of tapered holes hb (first holes) formed in a surface of a filling layer Zj. The interior of each of the tapered holes hb is filled with a first resin layer 20, and each of a plurality of convex-side top portions kb (a portion exposed from the first resin layer 20) of the first lead wiring line Wfb, and a second lead wiring line Wsb that is flat and that covers the first resin layer 20 are in contact with each other, and the first lead wiring line Wfb and the second lead wiring line Wsb are electrically connected to each other. Note that the second lead wiring line Wsb is covered with a second resin layer 21.

As illustrated in FIG. 10(a), a distance h1 from an upper face of the first resin layer that fills the tapered hole hb to a base material 10 is smaller than a distance h2 from a convex-side top portion of the first lead wiring line Wsb to the base material.

In FIG. 10(a), the first lead wiring line Wfb and the second lead wiring line Wsb form a space truss structure. This space truss structure is interposed between the filling layer Zj that is flexible and the second resin layer 21 and the interior of the space truss structure is filled with the first resin layer 20 that is flexible, and the space truss structure has high stress resistance at the time of bending. Accordingly, generation of a crack in the lead wiring line between a display side wiring line TWb and a terminal side wiring line twb can be prevented, and an increase in resistance or generation of disconnection can be avoided. In addition, a region outside a bending portion ZS (a region including a terminal portion TS) can be bent back to a front face side (the second resin layer 21 side) by 180 degrees.

In FIG. 10(b), the first lead wiring line Wfb is formed in a shape including irregularities in accordance with the plurality of tapered holes hb (the first holes) formed in the surface of the filling layer Zj, and the second lead wiring line Wsb is formed in a shape including irregularities in accordance with a plurality of tapered holes Hb (second holes) formed in the first resin layer 20. The interior of each of the tapered holes hb is filled with the first resin layer 20, and each of the convex-side top portions kb of the first lead wiring line Wfb and a concave-side bottom portion jb of the second lead wiring line Wsb (a portion exposed to a bottom of each of the plurality of tapered holes Hb) are in contact with each other.

In FIG. 10(b) the first lead wiring line Wfb and the second lead wiring line Wsb form a three-dimensional network structure. This three-dimensional network structure is interposed between the filling layer Zj that is flexible and the second resin layer 21 and the interior of the three-dimensional network structure is filled with the first resin layer 20 that is flexible, and the three-dimensional network structure has high stress resistance at the time of bending. Accordingly, generation of a crack in the lead wiring line between the display side wiring line TWb and the terminal side wiring line twb can be prevented, and an increase in resistance or generation of disconnection of the lead wiring line can be avoided.

Supplement

Aspect 1

A display device provided with a display region including a light-emitting element and a frame region surrounding the display region on a base material, and provided with a bending portion formed between a terminal portion disposed in one end portion of the frame region and the display region, the display device including a TFT layer including a transistor, and a light-emitting element layer including the light-emitting element, wherein the TFT layer is provided with an inorganic insulating film, a first metal layer, a first resin layer, and a second metal layer in that order, in the bending portion, a slit is formed in the inorganic insulating film, and a filling layer is provided and fills the slit, in the bending portion, a plurality of lead wiring lines intersecting the bending portion are provided, each of the plurality of lead wiring lines connects a wiring line inside the display region and a terminal of the terminal portion, each of the plurality of lead wiring lines includes a first lead wiring line formed in the first metal layer and a second lead wiring line overlapping the first lead wiring line and formed in the second metal layer, the first lead wiring line and the second lead wiring line are electrically connected to each other, and the display device includes at least one of each of a plurality of first holes formed in the filling layer across the first lead wiring line and including surfaces being in contact with the first lead wiring line, and each of a plurality of second holes formed in the first resin layer across the second lead wiring line and including surfaces being in contact with the second lead wiring line.

Aspect 2

The display device according to aspect 1, for example, wherein the second lead wiring line includes a plurality of irregularities corresponding to the plurality of second holes passing through the first resin layer, and the first lead wiring line and a plurality of concave-side bottom portions of the second lead wiring line are in contact with each other.

Aspect 3

The display device according to aspect 2, for example, wherein each of the plurality of second holes is a tapered hole becoming smaller toward a lower layer side.

Aspect 4

The display device according to aspect 1, for example, wherein the first lead wiring line includes a plurality of irregularities corresponding to the plurality of first holes, and a plurality of convex-side top portions of the first lead wiring line that are exposed from the first resin layer, and the second lead wiring line are in contact with each other.

Aspect 5

The display device according to aspect 4, for example, wherein each of the plurality of first holes is a tapered hole becoming smaller toward a lower layer side.

Aspect 6

The display device according to any one of aspects 2 to 5, for example, wherein the first lead wiring line and the second lead wiring line form a space truss structure.

Aspect 7

The display device according to aspect 1, for example, wherein the first lead wiring line includes a plurality of irregularities corresponding to the plurality of first holes, the second lead wiring line includes a plurality of irregularities corresponding to the plurality of second holes, and a plurality of convex-side top portions of the first lead wiring line and a plurality of concave-side bottom portions of the second lead wiring line are in contact, respectively.

Aspect 8

The display device according to any one of aspects 1 to 7, for example, wherein, in at least one of each of the plurality of first holes and each of the plurality of second holes, an inter-hole distance in an extending direction of the plurality of lead wiring lines is different in accordance with a position in the extending direction in the bending portion.

Aspect 9

The display device according to aspect 8, for example, wherein the inter-hole distance in a center portion is greater than the inter-hole distance in both end portions of the bending portion.

Aspect 10

The display device according to any one of aspects 1 to 7, for example, wherein, in at least one of each of the plurality of first holes and each of the plurality of second holes, an inter-hole distance in an extending direction of the plurality of lead wiring lines is set in accordance with a radius of curvature of the bending portion.

Aspect 11

The display device according to aspect 10, for example, wherein, as the radius of curvature of the bending portion becomes smaller, the inter-hole distance becomes shorter.

Aspect 12

The display device according to any one of aspects 1 to 11, for example, wherein each of the plurality of lead wiring lines includes a data lead wiring line through which a data signal is transmitted, and a power supply lead wiring line through which a power supply voltage is transmitted, a width of the power supply lead wiring line is greater than a width of the data lead wiring line, and the plurality of first holes or the plurality of second holes overlapping the power supply lead wiring line in a width direction of the power supply lead wiring line are provided.

Aspect 13

The display device according to any one of aspects 1 to 12, for example, wherein a data signal line is constituted by using the first metal layer.

Aspect 14

The display device according to any one of aspects 1 to 13, for example, wherein each of the plurality of first holes and the plurality of second holes has a shape of any of an angular pyramid, a cone, a truncated pyramid, and a truncated cone that taper toward a lower layer side.

Aspect 15

The display device according to any one of aspects 1 to 14, for example, including a second resin layer that covers the second metal layer.

Aspect 16

The display device according to aspect 4, for example, wherein a distance from an upper face of the first resin layer filling each of the plurality of first holes to the base material is smaller than a distance from each of the plurality of convex-side top portions of the first lead wiring line to the base material.

The invention claimed is:

1. A display device provided with a display region including a light-emitting element and a frame region surrounding the display region on a base material, and provided with a bending portion formed between a terminal portion disposed in one end portion of the frame region and the display region, the display device comprising:
   a TFT layer including a transistor; and
   a light-emitting element layer including the light-emitting element,
   wherein the TFT layer is provided with an inorganic insulating film, a first metal layer, a first resin layer, and a second metal layer in that order,
   in the bending portion, a slit is formed in the inorganic insulating film, and a filling layer is provided and fills the slit,
   in the bending portion, a plurality of lead wiring lines intersecting the bending portion are provided,
   each of the plurality of lead wiring lines connects a wiring line inside the display region and a terminal of the terminal portion,
   each of the plurality of lead wiring lines includes a first lead wiring line formed in the first metal layer and a second lead wiring line overlapping the first lead wiring line and formed in the second metal layer,
   the first lead wiring line and the second lead wiring line are electrically connected to each other, and
   the display device includes at least one of each of a plurality of first holes formed in the filling layer across the first lead wiring line and including surfaces being in contact with the first lead wiring line, and each of a plurality of second holes formed in the first resin layer across the second lead wiring line and including surfaces being in contact with the second lead wiring line.

2. The display device according to claim 1, wherein the second lead wiring line includes a plurality of irregularities corresponding to the plurality of second holes passing through the first resin layer, and the first lead wiring line and a plurality of concave-side bottom portions of the second lead wiring line are in contact with each other.

3. The display device according to claim 2, wherein each of the plurality of second holes is a tapered hole becoming smaller toward a lower layer side.

4. The display device according to claim 2, wherein the first lead wiring line and the second lead wiring line form a space truss structure.

5. The display device according to claim 1, wherein the first lead wiring line includes a plurality of irregularities corresponding to the plurality of first holes, and a plurality of convex-side top portions of the first lead wiring line that are exposed from the first resin layer, and the second lead wiring line are in contact with each other.

6. The display device according to claim 5, wherein each of the plurality of first holes is a tapered hole becoming smaller toward a lower layer side.

7. The display device according to claim 5, wherein a distance from an upper face of the first resin layer filling each of the plurality of first holes to the base material is smaller than a distance from each of the plurality of convex-side top portions of the first lead wiring line to the base material.

8. The display device according to claim 1, wherein the first lead wiring line includes a plurality of irregularities corresponding to the plurality of first holes, the second lead wiring line includes a plurality of irregularities corresponding to the plurality of second holes, and a plurality of convex-side top portions of the first lead wiring line and a plurality of concave-side bottom portions of the second lead wiring line are in contact, respectively.

9. The display device according to claim 1, wherein, in at least one of each of the plurality of first holes and each of the plurality of second holes, an inter-hole distance in an extending direction of the plurality of lead wiring lines is different in accordance with a position in the extending direction in the bending portion.

10. The display device according to claim 9, wherein the inter-hole distance in a center portion is greater than the inter-hole distance in both end portions of the bending portion.

11. The display device according to claim 1, wherein, in at least one of each of the plurality of first holes and each of the plurality of second holes, an inter-hole distance in an extending direction of the plurality of lead wiring lines is set in accordance with a radius of curvature of the bending portion.

12. The display device according to claim 11, wherein, as the radius of curvature of the bending portion becomes smaller, the inter-hole distance becomes shorter.

13. The display device according to claim 1, wherein each of the plurality of lead wiring lines includes a data lead wiring line through which a data signal is transmitted, and a power supply lead wiring line through which a power supply voltage is transmitted, a width of the power supply lead wiring line is greater than a width of the data lead wiring line, and the plurality of first holes or the plurality of second holes overlapping the power supply lead wiring line in a width direction of the power supply lead wiring line are provided.

14. The display device according to claim 1, wherein a data signal line is constituted by using the first metal layer.

15. The display device according to claim 1, wherein each of the plurality of first holes and the plurality of second holes has a shape of any of an angular pyramid, a cone, a truncated pyramid, and a truncated cone that taper toward a lower layer side.

16. The display device according to claim 1, comprising: a second resin layer that covers the second metal layer.

* * * * *